(12) United States Patent
Jeon et al.

(10) Patent No.: US 11,422,421 B2
(45) Date of Patent: Aug. 23, 2022

(54) LIQUID CRYSTAL DISPLAY

(71) Applicant: Samsung Display Co., Ltd., Yongin-Si (KR)

(72) Inventors: Young Jae Jeon, Asan-si (KR); Shin Tack Kang, Yongin-si (KR); Su In Kim, Gunpo-si (KR); Ju Yong Park, Asan-si (KR); Gi Jung Lee, Asan-si (KR); Sol Ip Jeong, Cheonan-si (KR)

(73) Assignee: Samsung Display Co., Ltd.

( * ) Notice: Subject to any disclaimer, the term of this patent is extended or adjusted under 35 U.S.C. 154(b) by 155 days.

(21) Appl. No.: 16/785,554

(22) Filed: Feb. 7, 2020

(65) Prior Publication Data

US 2020/0363689 A1    Nov. 19, 2020

(30) Foreign Application Priority Data

May 15, 2019 (KR) .......................... 10-2019-0056889

(51) Int. Cl.
*G02F 1/1362* (2006.01)
*H01L 27/12* (2006.01)

(52) U.S. Cl.
CPC .... *G02F 1/136286* (2013.01); *G02F 1/13624* (2013.01); *H01L 27/124* (2013.01)

(58) Field of Classification Search
CPC ................................................ G02F 1/136286
See application file for complete search history.

(56) References Cited

U.S. PATENT DOCUMENTS

| | | | |
|---|---|---|---|
| 2010/0033470 A1* | 2/2010 | Lee | G02F 1/13624 345/212 |
| 2012/0105785 A1* | 5/2012 | Kim | G09G 3/3648 349/139 |
| 2013/0093658 A1* | 4/2013 | Park | G02F 1/1368 345/92 |
| 2015/0187318 A1* | 7/2015 | Kim | G02F 1/13624 345/206 |
| 2016/0313594 A1* | 10/2016 | Kim | G02F 1/13624 |

(Continued)

FOREIGN PATENT DOCUMENTS

| | | |
|---|---|---|
| KR | 10-2017-0010964 A | 2/2017 |
| KR | 10-2017-0115135 A | 10/2017 |
| KR | 10-2018-0002967 A | 1/2018 |

(Continued)

*Primary Examiner* — Sang V Nguyen
(74) *Attorney, Agent, or Firm* — Innovation Counsel LLP (57) ABSTRACT

A liquid crystal display includes a gate line; a data line crossing the gate line; a first voltage line spaced apart from the gate line; a second voltage line, a first transistor including a first gate electrode connected to the gate line, a first source electrode connected to the data line, and a first drain electrode; a second transistor including a second gate electrode connected to the gate line, a second source electrode connected to the data line, and a second drain electrode; a third transistor including a third gate electrode connected to the first voltage line, a third source electrode connected to the second drain electrode, and a third drain electrode connected to the second voltage line; a first liquid crystal capacitor connected to the first drain electrode of the first transistor; and a second liquid crystal capacitor connected to the second drain electrode of the second transistor.

11 Claims, 5 Drawing Sheets

(56) References Cited

U.S. PATENT DOCUMENTS

2017/0108723 A1* 4/2017 No .................... G02F 1/133514
2017/0317155 A1* 11/2017 Oh ...................... H01L 27/3258

FOREIGN PATENT DOCUMENTS

| KR | 10-1825214 B1 | 3/2018 |
| KR | 10-1936923 B1 | 1/2019 |
| KR | 10-2019-0014559 A | 2/2019 |

* cited by examiner

LIQUID CRYSTAL DISPLAY

CROSS-REFERENCE TO RELATED APPLICATION

This application claims priority to and the benefit of Korean Patent Application No. 10-2019-0056889 filed in the Korean Intellectual Property Office on May 15, 2019, the entire contents of which are incorporated herein by reference.

BACKGROUND

(a) Technical Field

The present disclosure relates to a liquid crystal display. More particularly, the present disclosure relates to a liquid crystal display capable of improving lateral visibility.

(b) Description of the Related Art

A liquid crystal display as one of widely used flat panel displays includes a liquid crystal layer containing liquid crystal molecules, field generating electrodes for controlling alignment of the liquid crystal molecules of the liquid crystal layer, signal lines for applying voltages to the field generating electrodes, and a switching element connected thereto. When the voltage is applied to the field-generating electrodes, an electric field is generated in the liquid crystal layer, and the liquid crystal molecules are rearranged, and accordingly, desired images may be displayed by controlling an amount of transmitted light. The liquid crystal display may include at least one polarizer for adjusting the amount of transmitted light.

Among these liquid crystal displays, a liquid crystal display of a vertically aligned mode in which long axes of the liquid crystal molecules are arranged to be perpendicular to a display panel in a state where an electric field is not applied has a large contrast ratio and easily realizes a wide reference viewing angle.

The liquid crystal display of the vertical alignment (VA) mode has lower side visibility compared to front visibility. To solve this problem, one pixel is divided into two sub-pixels and the different voltages are applied to the two sub-pixels.

The above information disclosed in this Background section is only for enhancement of understanding of the background of the disclosure and therefore it may contain information that does not form the prior art that is already known in this country to a person of ordinary skill in the art.

SUMMARY

The present disclosure provides a liquid crystal display capable of easily adjusting a voltage ratio of two sub-pixels included in one pixel while improving lateral visibility.

Also, the present disclosure provides a liquid crystal display capable of reducing a light leakage current and increasing freedom of arrangement of a transistor and size control.

A liquid crystal display according to an example embodiment of the present disclosure includes a gate line; a data line crossing the gate line; a first voltage line spaced apart from the gate line; a second voltage line; a first transistor including a first gate electrode connected to the gate line, a first source electrode connected to the data line, and a first drain electrode; a second transistor including a second gate electrode connected to the gate line, a second source electrode connected to the data line, and a second drain electrode; a third transistor including a third gate electrode connected to the first voltage line, a third source electrode connected to the second drain electrode, and a third drain electrode connected to the second voltage line; a first liquid crystal capacitor connected to the first drain electrode of the first transistor; and a second liquid crystal capacitor connected to the second drain electrode of the second transistor.

The first transistor and the second transistor may include a first semiconductor, and the third transistor may include a second semiconductor spaced apart from the first semiconductor.

The first gate electrode and the second gate electrode may be connected to each other to form one gate electrode, the first semiconductor may overlap the gate electrode, and the second semiconductor may overlap the third gate electrode.

An edge of the first semiconductor may be disposed inside edges of the gate electrode and the gate line in a plan view, and the edge of the first semiconductor may be spaced apart from the edges of the gate electrode and the gate line.

The edge of the second semiconductor may be disposed inside the edge of the third gate electrode and the first voltage line in the plan view, and the edge of the second semiconductor may be spaced apart from the edge of the third gate electrode and the first voltage line.

The gate line may extend in a first direction, the first source electrode and the second source electrode may include two first branches respectively extending in a second direction perpendicular to the first direction, the first drain electrode may include a second branch disposed between the two first branches, and a first extended part connected to the second branch, and the second drain electrode may include a third branch extending in the second direction, and a second extended part connected to the third branch.

The second voltage line may be spaced apart from the data line and disposed in a same conductive layer as the data line, and the third drain electrode may extend in the second direction.

The first extended part and the second extended part may be faced each other with respect to the gate line in the plan view.

One terminal of the first liquid crystal capacitor may include a first sub-pixel electrode electrically connected to the first drain electrode, one terminal of the second liquid crystal capacitor may include a second sub-pixel electrode electrically connected to the second drain electrode, and the first sub-pixel electrode and the second sub-pixel electrode may be faced each other with respect to the gate line in the plan view.

A third voltage line spaced apart from the gate line and opposing the first voltage line with respect to the gate line may be further included, the first extended part may overlap the third voltage line to form a first storage capacitor, and the second extended part may overlap the first voltage line to form a second storage capacitor.

The voltage transmitted by the first voltage line and the voltage transmitted by the second voltage line may be constant.

A display device according to an example embodiment of the present disclosure includes a substrate; a gate line and a storage voltage line which are disposed on the substrate and spaced apart from each other; a first semiconductor and a second semiconductor which are disposed on the gate line and the storage voltage line and spaced apart from each other; a data line disposed on the first semiconductor and the second semiconductor, a first source electrode and a second source electrode connected to the data line, a first drain electrode facing the first source electrode; a second drain electrode facing the second source electrode; a third source electrode connected to the second drain electrode, a reference voltage line including a third drain electrode; and a first sub-pixel electrode disposed on the first semiconductor and the second semiconductor and electrically connected to the first drain electrode, and a second sub-pixel electrode disposed on the first semiconductor and the second semiconductor and electrically connected to the second drain electrode, wherein the first semiconductor overlaps a gate electrode included in the gate line, the second semiconductor overlaps an extended part included in the storage voltage line, the first source electrode, the second source electrode, first drain electrode, and the second drain electrode overlap the first semiconductor, and the third source electrode and the third drain electrode overlap the second semiconductor.

The edge of the first semiconductor may be disposed inside the edge of the gate line in a plan view, and the edge of the first semiconductor may be spaced apart from the edge of the gate line.

The edge of the second semiconductor may be disposed inside the edge of the storage voltage line in the plan view, and the edge of the second semiconductor may be spaced apart from the edge of the storage voltage line.

The gate line may extend in a first direction, the first source electrode and the second source electrode may include two first branches respectively extending in a second direction perpendicular to the first direction, the first drain electrode may include a second branch disposed between the two first branches, and a first extended part connected to the second branch, and the second drain electrode may include a third branch extending in the second direction, and a second extended part connected to the third branch.

The reference voltage line may be spaced apart from the data line, and the third drain electrode may extend in the second direction.

The first extended part and the second extended part may be faced each other with respect to the gate line in the plan view.

The first sub-pixel electrode and the second sub-pixel electrode may be faced each other with respect to the gate line in the plan view.

A display device according to an example embodiment of the present disclosure includes a gate line and a storage voltage line respectively extending in a first direction and spaced apart from each other; a data line and a reference voltage line respectively extending in a second direction crossing the first direction and spaced apart from each other; a first transistor and a second transistor which are connected to the gate line and the data line; a third transistor connected to the second transistor and connected to the storage voltage line and the reference voltage line; a first sub-pixel electrode electrically connected to the first transistor; and a second sub-pixel electrode electrically connected to the second transistor and the third transistor, wherein the first and second transistors include a first semiconductor overlapping the gate line, and the third transistor includes a second semiconductor overlapping the storage voltage line and spaced apart from the first semiconductor.

An edge of the first semiconductor may be disposed inside an edge of the gate line in a plan view, and the edge of the first semiconductor may be spaced apart from the edge of the gate line.

According to an example embodiment of the present disclosure, the liquid crystal display in which the adjustment of the voltage ratio of two sub-pixels included in one pixel may be easy, a light leakage current may be reduced, and freedom of adjustment of the arrangement and the size of the transistors may be increased while the lateral visibility of the liquid crystal display may be improved, is provided.

DETAILED DESCRIPTION OF THE EMBODIMENTS

The present disclosure will be described more fully hereinafter with reference to the accompanying drawings, in which example embodiments of the disclosure are shown. As those skilled in the art would realize, the described embodiments may be modified in various different ways, all without departing from the spirit or scope of the present disclosure.

In order to clearly describe the present disclosure, portions that are not connected with the description will be omitted, and like reference numerals designate like elements throughout the specification.

In addition, the size and thickness of each configuration shown in the drawings are arbitrarily shown for better understanding and ease of description, but the present disclosure is not limited thereto. In the drawings, the thickness of layers, films, panels, regions, etc., are exaggerated for clarity. In the drawings, for better understanding and ease of description, the thickness of some layers and areas is exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Throughout this specification and the claims which follow, a plan view means a view when observing a surface parallel to two directions (e.g., a direction DR1 and a direction DR2) crossing each other, and a cross-sectional view means a view when observing a surface cut in a direction (e.g., a direction DR3) perpendicular to the surface parallel to the direction DR1 and the direction DR2. Also, to overlap two constituent elements means that two constituent elements are overlapped in the direction DR3 (e.g., a direction perpendicular to an upper surface of the substrate) unless stated otherwise.

First, a liquid crystal display according to an example embodiment is described with reference to FIG. 1.

Figure 1:
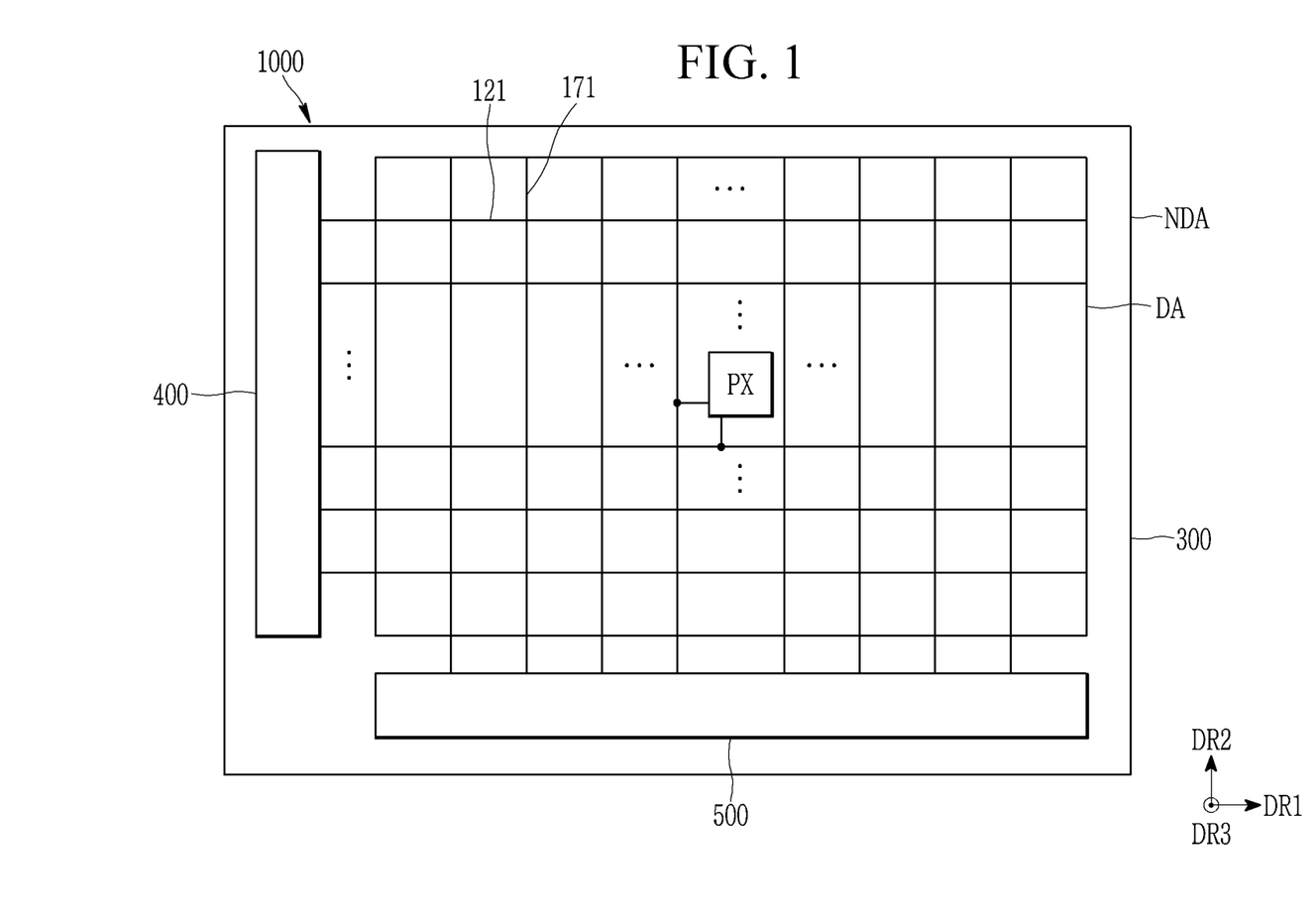
FIG. 1 is a schematic layout view of a liquid crystal display according to an example embodiment of the present disclosure.

FIG. 1 is a schematic layout view of a liquid crystal display according to an example embodiment of the present disclosure.

A liquid crystal display 1000 according to an example embodiment includes a display panel 300 including a display area DA that is a region capable of displaying an image, and the display panel 300 may include a non-display area NDA disposed around the display area DA.

The display area DA includes a plurality of pixels PX, and a plurality of gate lines 121 and a plurality of data lines 171.

The plurality of gate lines 121 may transmit a gate signal and may be arranged in a second direction DR2. Each gate line 121 may approximately extend in a first direction DR1.

The plurality of data lines 171 may transmit a data signal and may be arranged in the first direction DR1. Each data line 171 may approximately extend in the second direction DR2, thereby crossing the plurality of gate lines 121.

Each pixel PX may include a plurality of transistors connected to at least one gate line 121 and at least one data line 171, and a plurality of sub-pixel electrodes connected thereto. A plurality of sub-pixel electrodes included in one pixel PX are together referred to as a pixel electrode of the corresponding pixel PX. In a plan view, the region corresponding to each pixel electrode may display light having a luminance of an input image signal for each pixel PX.

The liquid crystal display 1000 according to an example embodiment of the present disclosure may include a gate driver 400 and a data driver 500.

The gate driver 400 may be disposed in the non-display area NDA of the display panel 300. The gate driver 400 may generate a gate signal to be applied to the gate line 121. The gate driver 400 may include a plurality of transistors that are directly formed on the substrate in the same process as the transistor of the pixel PX.

The data driver 500 may apply a data signal to the data line 171. The data driver 500 may be directly mounted on the display panel 300 in a form of at least one IC chip, mounted on a flexible printed circuit film and attached to the display panel 300, or mounted on a separate printed circuit board (PCB).

The gate driver 400 may display an image of one frame by sequentially applying the gate signal of a gate-on voltage to a plurality of gate lines 121 with a horizontal period as a unit, and applying the data voltage to all pixels PX. If one frame is finished, the next frame starts, and the data voltage of a new frame may be applied to all pixels PX.

The structure of the pixel PX of the liquid crystal display according to an example embodiment of the present disclosure is now described with reference to FIG. 2 and FIG. 1.

Figure 2:
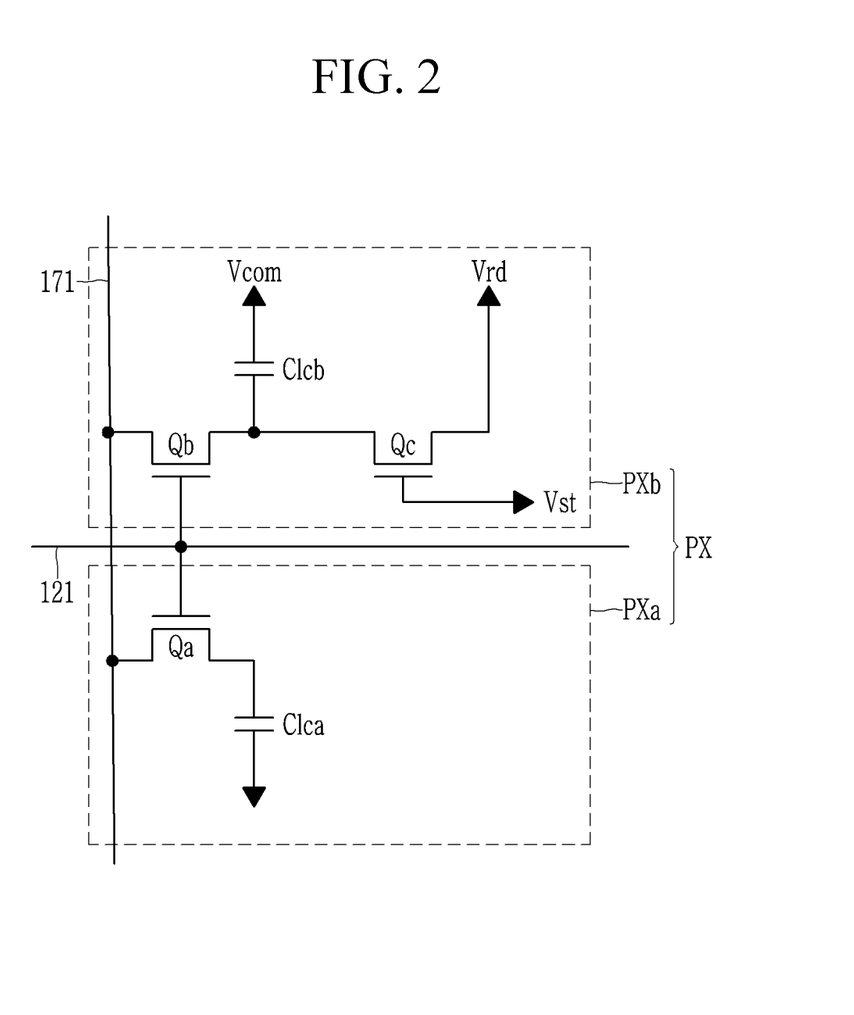
FIG. 2 is an equivalent circuit diagram of one pixel of a liquid crystal display according to an example embodiment of the present disclosure.

FIG. 2 is an equivalent circuit diagram of one pixel PX of a liquid crystal display according to an example embodiment of the present disclosure.

Referring to FIG. 2, one pixel PX includes a first sub-pixel PXa and a second sub-pixel PXb.

The first sub-pixel PXa includes a first transistor Qa connected to one data line 171 and one gate line 121, and a first liquid crystal capacitor Clca connected to the first transistor Qa. The second sub-pixel PXb includes a second transistor Qb connected to the same data line 171 and gate line 121 as the data line 171 and gate line 121 connected to the first transistor Qa, and a third transistor Qc and a second liquid crystal capacitor Clcb connected thereto.

The first transistor Qa may include a gate electrode connected to the gate line 121, a source electrode connected to the data line 171, and a drain electrode connected to the first liquid crystal capacitor Clca. One terminal of the first liquid crystal capacitor Clca may include the first sub-pixel electrode connected to the drain electrode of the first transistor Qa, and the other terminal of the first liquid crystal capacitor Clca may be connected to a common voltage Vcom. The common voltage Vcom may be, for example, approximately from 6 V to 7 V. The first transistor Qa is controlled to be turned on/off depending on the gate signal transmitted by the gate line 121 to transmit the data voltage transmitted by the data line 171 to the first liquid crystal capacitor Clca.

The second transistor Qb may include a gate electrode connected to the gate line 121 which the first transistor Qa is connected to, a source electrode connected to the data line 171, and a drain electrode connected to the second liquid crystal capacitor Clcb and the source electrode of the third transistor Qc. One terminal of the second liquid crystal capacitor Clcb may include a second sub-pixel electrode connected to the drain electrode of the second transistor Qb, and the other terminal of the second liquid crystal capacitor Clcb may be connected to the common voltage Vcom. The second transistor Qb may be controlled to be turned on/off depending on the gate signal transmitted by the gate line 121 to transmit the data voltage transmitted by the data line 171 to the second liquid crystal capacitor Clcb.

The third transistor Qc may include a gate electrode connected to a storage voltage line transmitting a first voltage Vst (referred to as a storage voltage), a source electrode connected to the drain electrode of the second transistor Qb, and a drain electrode connected to a reference voltage line transmitting a second voltage Vrd (referred to as reference voltage). The third transistor Qc may flow a source-drain current depending on a gate-source potential difference and a source-drain potential difference. If the second transistor Qb is turned on, the data voltage transmitted by the data line 171 may be divided by the second transistor Qb and the third transistor Qc to be transmitted to the second liquid crystal capacitor Clcb. In this case, the voltage of the second sub-pixel electrode that is one terminal of the second liquid crystal capacitor Clcb may be gradually changed into the second voltage Vrd for one frame. The first voltage Vst and the second voltage Vrd may each be a constant voltage. The second voltage Vrd may be, for example, the same as or similar to the common voltage Vcom. When the second voltage Vrd is different from the common voltage Vcom, the difference between the second voltage Vrd and the common voltage Vcom may be approximately 2 V or less, but is not limited thereto. The first voltage Vst may be equal to or similar to the common voltage Vcom, but is not limited thereto.

The first sub-pixel PXa and the second sub-pixel PXb may display images according to different gamma curves or images according to the same gamma curve for one input image signal. Here, the gamma curve means a curve which shows the change of luminance or transmittance of a gray of the input image signal. That is, for the same input image signal, the voltages of the first sub-pixel electrode that is one terminal of the first liquid crystal capacitor Clca and the second sub-pixel electrode that is one terminal of the second liquid crystal capacitor Clcb may be different, thereby representing the different luminances from each other depending on each gamma curve of the first sub-pixel PXa and the second sub-pixel PXb. In this case, the voltage of the first sub-pixel electrode and the voltage of the second sub-pixel electrode may be an average voltage during one frame.

To improve the lateral visibility of the display device, the voltages charged to the first liquid crystal capacitor Clca and the second liquid crystal capacitor Clcb need to be adjusted appropriately, and particularly it is necessary to appropriately control a voltage ratio of the first liquid crystal capacitor Clca and the second liquid crystal capacitor Clcb.

The gamma curve or the luminance depending on the second sub-pixel PXb may be adjusted by controlling characteristics such as a ratio of the channel width and the channel length of the third transistor Qc and the second transistor Qb, a size, a resistance, and the like, and the second voltage Vrd and the first voltage Vst. In other words, the luminance of the two sub-pixels PXa and PXb may be varied by adjusting the charging voltage of the second liquid crystal capacitor Clcb by controlling the characteristic of the second transistor Qb and the third transistor Qc, the second voltage Vrd, and the first voltage Vst, and as the charged voltages of the first liquid crystal capacitor Clca and the second liquid crystal capacitor Clcb are appropriately adjusted, the lateral visibility of the display device may be improved.

In the description of the present disclosure, the source electrode and the drain electrode of one transistor are used to distinguish two electrodes with respect to the gate electrode from each other, and the two names may be mutually exchanged.

Next, the detailed structure of the liquid crystal display according to an example embodiment of the present disclosure is described with reference to FIG. 3 to FIG. 5 as well as FIG. 1 and FIG. 2.

Figure 3:
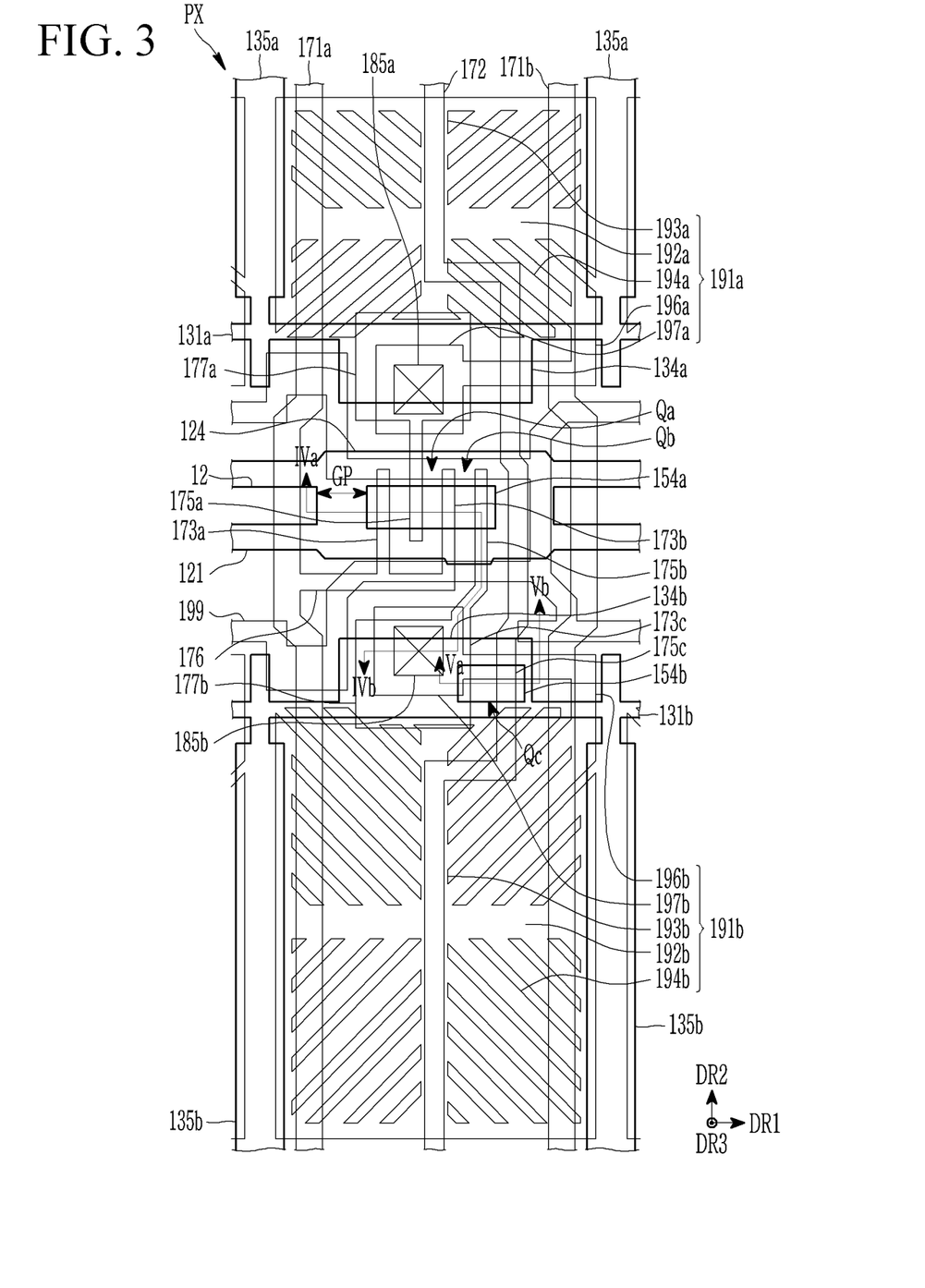
FIG. 3 is a layout view of one pixel of a liquid crystal display according to another example embodiment of the present disclosure.
Figure 4:
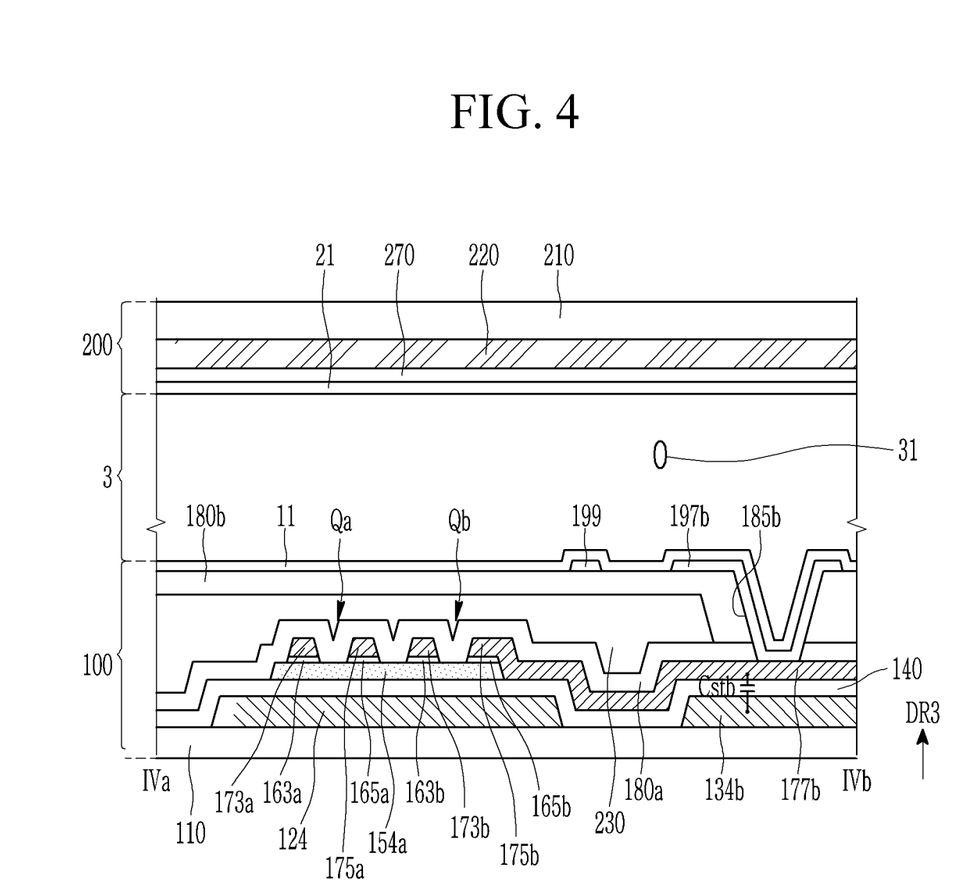
FIG. 4 is a cross-sectional view of a liquid crystal display shown in FIG. 3 taken along a line IVa-IVb.
Figure 5:
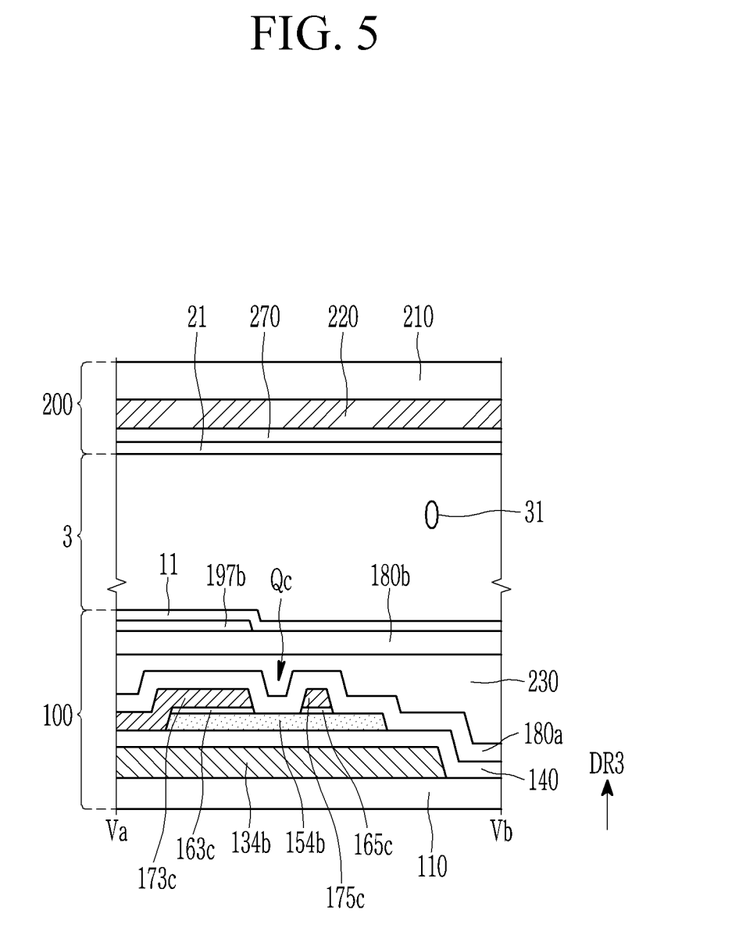
FIG. 5 is a cross-sectional view of a liquid crystal display shown in FIG. 3 taken along a line Va-Vb.

FIG. 3 is a layout view for one pixel of a liquid crystal display according to another example embodiment of the present disclosure, FIG. 4 is a cross-sectional view of a liquid crystal display shown in FIG. 3 taken along a line IVa-IVb, and FIG. 5 is a cross-sectional view of a liquid crystal display shown in FIG. 3 taken along a line Va-Vb.

The liquid crystal display according to an example embodiment of the present disclosure may include a first display panel 100 and a second display panel 200, and a liquid crystal layer 3 disposed between the two display panels 100 and 200.

Referring to the first display panel 100, a gate conductive layer including the gate line 121, a first storage voltage line 131a, and a second storage voltage line 131b is disposed on an insulating substrate 110.

The gate line 121 transmits the gate signal, and may be extended in the first direction DR1. The gate line 121 includes a gate electrode 124, and may include a plurality of openings 12 formed therein. The gate electrode 124 may extend in the second direction DR2 relative to the peripheral portion, and may be disposed between two openings 12 adjacent thereto. Alternatively, it may be described that the gate electrode 124 is connected to the gate line 121.

The first storage voltage line 131a, which transmits the storage voltage, is spaced apart from the gate line 121 and may extend substantially in the first direction DR1. The storage voltage may be the constant voltage, for example, a voltage that is equal to or similar to the common voltage Vcom. The first storage voltage line 131a may include an extended part 134a and a plurality of elongated parts 135a. The extended part 134a may be protruded or extended toward the side at which the gate line 121 is disposed from the first storage voltage line 131a. In the example embodiment shown in FIG. 3, the extended part 134a is extended downwardly from the first storage voltage line 131a. Alternatively, the extended part 134a may be connected to the first storage voltage line 131a. The elongated part 135a may be protruded and extended from the first storage voltage line 131a substantially in the second direction DR2. Referring to FIG. 3, the elongated part 135a may be protruded and extended upwardly from the first storage voltage line 131a, but is not limited thereto.

The second storage voltage line 131b may transmit the storage voltage Vst, and may be spaced apart from the gate line 121 and be substantially extended in the first direction DR1. The second storage voltage line 131b may include an extended part 134b and a plurality of elongated parts 135b. The extended part 134b may be protruded and extended from the second storage voltage line 131b toward the gate line 121. In the example embodiment shown in FIG. 3, the extended part 134b is extended upwardly from the second storage voltage line 131b. Alternatively, the extended part 134b may be connected to the second storage voltage line 131b. The elongated part 135b may be protruded and extended from the second storage voltage line 131b substantially in the second direction DR2. Referring to FIG. 3, the elongated part 135b may be protruded downwardly from the second storage voltage line 131b, but is not limited thereto.

The first storage voltage line 131a and the second storage voltage line 131b may be faced each other with respect to the gate line 121 therebetween. The storage voltage transmitted by the first storage voltage line 131a may be equal to the storage voltage Vst transmitted by the second storage voltage line 131b. The first storage voltage line 131a may be omitted.

A gate insulating layer 140 may be disposed on the gate conductive layer. The gate insulating layer 140 may include an insulating material such as a silicon nitride (SiNx), a silicon oxide (SiOx), and a silicon oxynitride (SiOxNy).

A first semiconductor 154a and a second semiconductor 154b are spaced apart from each other and disposed on the gate insulating layer 140.

The first semiconductor 154a is disposed on the gate electrode 124 and overlaps the gate electrode 124. The first semiconductor 154a may elongate in the first direction DR1, but is not limited thereto. The edge of the first semiconductor 154a and the edge of the opening 12 of the gate line 121 may be spaced apart by an interval GP that is larger than 0. In a plan view, the edge of the first semiconductor 154a is disposed inside the edge of the gate line 121 and may overlap the gate line 121 including the gate electrode 124, and the edge of the first semiconductor 154a may be spaced apart from the edge of the gate line 121.

The second semiconductor 154b is disposed on the extended part 134b of the second storage voltage line 131b and overlaps the extended part 134b. The length in the first direction DR1 of the second semiconductor 154b may be shorter than the length in the first direction DR1 of the first semiconductor 154a. In a plan view, the edge of the second semiconductor 154b may be disposed inside the edge of the second storage voltage line 131b including the extended part 134b, and the edge of the second semiconductor 154b may be disposed to be spaced apart from the edge of the second storage voltage line 131b including the extended part 134b.

The first semiconductor 154a and the second semiconductor 154b may include the semiconductor material such as amorphous silicon, polycrystalline silicon, or a metal oxide.

An ohmic contact layer including ohmic contacts 163a, 163b, 163c, 165a, 165b, and 165c may be disposed on the first semiconductor 154a and the second semiconductor 154b. The ohmic contact layer may be formed using a material such as n+ hydrogenated amorphous silicon into which an n-type impurity is doped at a high concentration, or a silicide.

A data conductive layer including data lines 171a and 171b, a reference voltage line 172, a first source electrode 173a, a second source electrode 173b, a third source electrode 173c, a first drain electrode 175a, a second drain electrode 175b, and a third drain electrode 175c is disposed on the ohmic contacts 163a, 163b, 163c, 165a, 165b, and 165c.

Each of the data lines 171a and 171b may be extended in the second direction DR2 and cross the gate line 121, and each may transmit the data voltage. Each of the data lines 171a and 171b may include a curved portion. Each of the data lines 171a and 171b may overlap the opening 12 of the gate line 121. The neighboring data lines 171a and 171b may include portions facing each other with respect to the gate electrode 124 therebetween.

The reference voltage line 172 may be extended in the second direction DR2 to cross the gate line 121 and transmit the second voltage Vrd. One reference voltage line 172 may be disposed between two neighboring data lines 171a and 171b, and is spaced apart from the data lines 171a and 171b. The reference voltage line 172 may include the curved portion. The reference voltage line 172 is spaced apart from the first semiconductor 154a without overlapping the first semiconductor 154a. The reference voltage line 172 includes a portion overlapping the second semiconductor 154b.

The first source electrode 173a may be electrically connected to the data line 171 via a connection part 176 disposed on the data conductive layer, and may be formed in an approximately U-shaped form. That is, the first source electrode 173a may include two vertical branches extending generally in the second direction DR2 and a horizontal branch connecting between two vertical branches and extending in the first direction DR1, thereby forming an approximately U-shaped form. The connection part 176 may extend substantially in the first direction DR1.

The first drain electrode 175a includes a branch facing the first source electrode 173a on the first semiconductor 154a, enclosed by the first source electrode 173a of the U-shaped form, and substantially extending in the second direction DR2, and an extended part 177a connected to the branch. The extended part 177a may overlap the extended part 134a of the first storage voltage line 131a. The branch of the first drain electrode 175a may be disposed between two vertical branches of the first source electrode 173a.

Two vertical branches of the first source electrode 173a extending in the second direction DR2 and the branch of the first drain electrode 175a extending in the second direction DR2 are overlapped with the first semiconductor 154a.

The gate electrode 124, the first source electrode 173a, and the first drain electrode 175a form the first transistor Qa along with the first semiconductor 154a. The part forming the first transistor Qa among the gate electrode 124 is referred to as the first gate electrode.

At least, some portions of the first source electrode 173a may be the second source electrode 173b. In detail, among some portions of the first source electrode 173a, the portion facing and adjacent to the second drain electrode 175b on the first semiconductor 154a may be the second source electrode 173b. For example, in FIG. 1, at least a part of the right vertical branch of two vertical branches of the first source electrode 173a facing each other with respect to the first drain electrode 175a may be the second source electrode 173b. Alternatively, the second source electrode 173b may be connected to the first source electrode 173a. In this case, the first source electrode 173a and the second source electrode 173b may be formed into the U-shape.

The second drain electrode 175b may include a branch facing the second source electrode 173b on the first semiconductor 154a and extending in the second direction DR2, and an extended part 177b connected to the branch. The extended part 177b may overlap the extended part 134b of the second storage voltage line 131b. The extended part 177b may face the extended part 177a with respect to the gate electrode 124 of the gate line 121, or the first semiconductor 154a. At least, some portions of the second drain electrode 175b may overlap the second semiconductor 154b.

The second source electrode 173b and the branch of the second drain electrode 175b extending in the second direction DR2 overlap the first semiconductor 154a.

The gate electrode 124, the second source electrode 173b, and the second drain electrode 175b together with the first semiconductor 154a form the second transistor Qa. The part forming the second transistor Qb among the gate electrode 124 is referred to as a second gate electrode.

At least, some portions of the second drain electrode 175b may be the third source electrode 173c. For example, in FIG. 1, on the second semiconductor 154b, the portion of the extended part 177b of the second drain electrode 175b facing the reference voltage line 172 and adjacent thereto may be the third source electrode 173c. Alternatively, the third source electrode 173c may be connected to the second drain electrode 175b.

Among some portions of the reference voltage line 172, the part overlapping the second semiconductor 154b and facing the third source electrode 173c on the second semiconductor 154b may form the third drain electrode 175c. The third drain electrode 175c may substantially extend in the second direction DR2.

The third source electrode 173c and the third drain electrode 175c overlap the second semiconductor 154b.

The extended part 134b of the second storage voltage line 131b, the third source electrode 173c, and the third drain electrode 175c form the third transistor Qc along with the second semiconductor 154b. That is, the gate electrode of the third transistor Qc may be the extended part 134b of the second storage voltage line 131b, and this is referred to as the third gate electrode.

Each of the first transistor Qa, the second transistor Qb, and the third transistor Qc may be a thin film transistor.

Each channel of the first transistor Qa, the second transistor Qb, and the third transistor Qc may be formed in the semiconductors 154a and 154b which are disposed between the first, second, and third source electrodes 173a, 173b, and 173c and the first, second, and third drain electrodes 175a, 175b, and 175c.

The gate conductive layer and the data conductive layer may be formed of at least one selected from a group consisting of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and alloys thereof.

A first insulating layer 180a may be disposed on the data conductive layer and the exposed part of the semiconductors 154a and 154b. The first insulating layer 180a may include the organic insulating material or the inorganic insulating material.

A color filter 230 may be disposed on the first insulating layer 180a. The color filter 230 may display one of primary colors such as three primary colors of red, green, and blue, or four primary colors. The color filter 230 may include an organic material and a pigment capable of displaying colors.

A second insulating layer 180b may be disposed on the color filter 230. The second insulating layer 180b may include an inorganic insulating material or an organic insulating material, and particularly includes the organic insulating material, to generally provide a planar top surface. The second insulating layer 180b may prevent the color filter 230 from being exposed and prevent impurities such as pigments from flowing into the liquid crystal layer 3.

The first and second insulating layers 180a and 180b may include an opening 185a formed on the extended part 177a of the first drain electrode 175a, and an opening 185b formed on the extended part 177b of the second drain electrode 175b.

A pixel electrode layer including a pixel electrode including a first sub-pixel electrode 191a and a second sub-pixel electrode 191b, and a shielding electrode 199, may be disposed on the second insulating layer 180b.

In a plan view, for each pixel PX, the first sub-pixel electrode 191a may be disposed on one side and the second sub-pixel electrode 191b may be disposed on the other side with respect to the gate line 121 and the first, second, and third transistors Qa, Qb, and Qc. In the example embodiment shown in FIG. 3, the first sub-pixel electrode 191a may be disposed upwardly with respect to the gate line 121, and the second sub-pixel electrode 191b may be disposed downwardly with respect to the gate line 121.

The first sub-pixel electrode 191a may include a transverse stem part 192a extending in the first direction DR1, a longitudinal stem part 193a connected to the transverse stem part 192a and extending in the second direction DR2, and a plurality of micro branches 194a connected to the transverse stem part 192a or the longitudinal stem part 193a and extending in an oblique direction with respect to the first direction DR1 and the second direction DR2. Also, the first sub-pixel electrode 191a may include an elongated part 196a protruded toward the extended part 177a of the first drain electrode 175a, and a contact portion 197a connected to the end of the elongated part 196a. The contact portion 197a is electrically connected to the extended portion 177a of the first drain electrode 175a through the opening 185a.

The second sub-pixel electrode 191b may include a transverse stem part 192b extending in the first direction DR1, a longitudinal stem part 193b connected to the transverse stem part 192b and extending in the second direction DR2, and a plurality of micro branches 194b connected to the transverse stem part 192b or the longitudinal stem part 193b and extending in the oblique direction with respect to the first direction DR1 and the second direction DR2. Also, the second sub-pixel electrode 191b may include an elongated portion 196b protruded toward the extended portion 177b of the second drain electrode 175b and a contact portion 197b connected at the end of the elongated portion 196b. The contact portion 197b is electrically connected to the extended portion 177b of the second drain electrode 175b through the opening 185b.

The reference voltage line 172 described above may include a portion extending parallel to and overlapping the longitudinal stem portion 193a of the first sub-pixel electrode 191a, and a portion extending parallel to and overlapping the longitudinal stem portion 193b of the second sub-pixel electrode 191b.

The shielding electrode 199 may overlap the edges or surroundings of the gate line 121 of the gate conductive layer and the first and second storage voltage lines 131a and 131b to shield a fringe field of the edges of the gate conductive layer and to prevent light leakage thereto.

The previously described elongated parts 135a and 135b of the first and second storage voltage lines 131a and 131b may shield the space between neighboring pixel electrodes to prevent light leakage.

The pixel electrode layer may include a transparent conductive material such as an indium-tin oxide (ITO), an indium-zinc oxide (IZO), and a metal thin film.

An alignment layer 11 may be disposed on the pixel electrode layer and the second insulating layer 180b. The alignment layer 11 may be a vertical alignment layer. The alignment layer 11 may be rubbed in at least one direction, or may contain an alignment aid including a reactive mesogen. If the alignment layer 11 includes the alignment aid, the alignment aid may form a side chain of a main chain and a side chain included in the alignment layer 11. Liquid crystal molecules 31 may be pretilted by this side chain.

According to another example embodiment of the present disclosure, the reference voltage line 172 may be disposed on a different layer from the data conductive layer. That is, the reference voltage line 172 may be disposed on a different conductive layer from the data line 171. For example, the reference voltage line 172 may be disposed on the gate conductive layer, which may be spaced from the gate line 121 and the first and second storage voltage lines 131a and 131b, and the third drain electrode 175c of the third transistor Qc disposed on the data conductive layer may be electrically connected to the reference voltage line disposed on the gate conductive layer through a separate opening included in the gate insulating layer 140 to receive a reference voltage.

Referring to the second display panel 200, a light blocking member 220 may be disposed on an insulating substrate 210 (below the substrate 210 in FIG. 4 and FIG. 5). The light blocking member 220 may include a portion overlapping the first, second, and third transistors Qa, Qb, and Qc, a portion overlapping the data lines 171a and 171b, and the like.

According to another example embodiment, the light blocking member 220 may be disposed on the first display panel 100 rather than the second display panel 200.

A common electrode 270 may be disposed on the light blocking member 220 (below the light blocking member 220 in FIG. 4 and FIG. 5). The common electrode 270 may be formed as a single continuum over the entire surface of the substrate 210. The common electrode 270 may transmit the common voltage Vcom.

The common electrode 270 may include the transparent conductive material such as ITO, IZO, the metal thin film, and the like.

An alignment layer 21 may be disposed on the common electrode 270 (below the common electrode 270 in FIG. 4 and FIG. 5). The alignment layer 21 may be the vertical alignment layer. The alignment layer 21 may be rubbed in at least one direction, or may include the alignment aid including the reactivity mesogen, like the alignment layer 11.

The liquid crystal layer 3 includes a plurality of liquid crystal molecules 31. The liquid crystal molecules 31 may have negative dielectric anisotropy, and may be aligned such that they are arranged substantially perpendicular to the substrates 110 and 210 while no electric field is generated in the liquid crystal layer 3. The liquid crystal molecules 31 may be pretilted in a predetermined direction when no electric field is generated in the liquid crystal layer 3.

The first sub-pixel electrode 191a may form the first liquid crystal capacitor Clca along with the common electrode 270 and the liquid crystal layer 3, and the second sub-pixel electrode 191b may form the second liquid crystal capacitor Clcb along with the common electrode 270 and the liquid crystal layer 3.

The extended part 177a of the first drain electrode 175a and the first sub-pixel electrode 191a overlaps the extended part 134a of the first storage voltage line 131a via the gate insulating layer 140 interposed therebetween, thereby forming a storage capacitor for reinforcing a function of maintaining a charged voltage of the first liquid crystal capacitor Clca. The extended part 177b of the second drain electrode 175b and the second sub-pixel electrode 191b overlaps the extended part 134b of the second storage voltage line 131b via the gate insulating layer 140 interposed therebetween, thereby forming the storage capacitor Cstb for reinforcing the function of maintaining the charged voltage of the second liquid crystal capacitor Clcb.

According to an example embodiment of the present disclosure, the first semiconductor 154a forming the first transistor Qa and the second transistor Qb overlaps the gate electrode 124, the second semiconductor 154b forming the third transistor Qc overlaps the extended part 134b of the second storage voltage line 131b, and the first semiconductor 154a is separated from the second semiconductor 154b.

Accordingly, compared with the case of forming the first, second, and third transistors Qa, Qb, and Qc by including the same gate electrode and the same semiconductor, the area where the first, second, and third transistors Qa, Qb, and Qc may be disposed is widened such that the arrangement and the size of the first, second, and third transistors Qa, Qb, and Qc may be freely adjusted, thereby increasing a degree of design freedom. Accordingly, in order to adjust the gamma curve due to the first sub-pixel PXa and the second sub-pixel PXb, it is easy to be designed by controlling the characteristics such as the ratio of the channel width and the channel length of the first, second, and third transistors Qa, Qb, and Qc, the size, the resistance, and the like.

Particularly, in the case of high resolution liquid crystal display, the space capable of forming the first and second transistors Qa, Qb and Qc may be sufficiently secured, and the arrangement and design of the first, second and third transistors Qa, Qb and Qc are easily changed such that the voltage ratio of the first liquid crystal capacitor Clca and the second liquid crystal capacitor Clcb be easily adjusted, accordingly the lateral visibility may be further improved.

Also, since it is possible to adjust the voltage of the second liquid crystal capacitor Clcb during one frame by controlling both of the second voltage Vrd and the first voltage Vst to which the third transistor Qc is connected, compared with a case in which the gate electrode of the third transistor Qc is connected to the gate line 121 like the first and second transistors Qa and Qb, it is easy to adjust the voltage ratio of the first liquid crystal capacitor Clca and the second liquid crystal capacitor Clcb.

For example, when slowly decreasing the voltage of the second liquid crystal capacitor Clcb of the second sub-pixel PXb, the first voltage Vst may be controlled to be close to the gate-off voltage, when quickly decreasing the voltage of the second liquid crystal capacitor Clcb of the second sub-pixel PXb, the first voltage Vst may be controlled to be close to the gate-on voltage. In addition, for example, when increasing the luminance of the second sub-pixel PXb, the second voltage Vrd may be adjusted to be close to the white voltage of the liquid crystal display.

Also, compared with a case that the first semiconductor 154a forms all of the first, second, and third transistors Qa, Qb, and Qc, the gap between the edge of the first semiconductor 154a and the edge of the opening 12 of the gate line 121 may have a sufficient margin since the size of the first semiconductor 154a may be reduced to such an extent that only the first and second transistors Qa and Qb may be formed. Therefore, the first semiconductor 154a may be light-shielded with the sufficient margin by the gate conductive layer including the gate line 121, so that the leakage current due to the light of the first and second transistors Qa and Qb may be reduced.

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims.

What is claimed is:

1. A liquid crystal display comprising:
   a gate line;
   a data line crossing the gate line;
   a first voltage line spaced apart from the gate line;
   a second voltage line spaced apart from the data line and disposed in a different layer from the first voltage line, the second voltage line overlapping and crossing the first voltage line;
   a third voltage line spaced apart from the gate line and opposing the first voltage line with respect to the gate line therebetween;
   a first transistor including a first gate electrode connected to the gate line, a first source electrode connected to the data line, and a first drain electrode;
   a second transistor including a second gate electrode connected to the gate line, a second source electrode connected to the data line, and a second drain electrode;
   a third transistor including a third gate electrode connected to the first voltage line, a third source electrode connected to the second drain electrode, and a third drain electrode directly connected to the second voltage line;
   a first liquid crystal capacitor connected to the first drain electrode of the first transistor; and
   a second liquid crystal capacitor connected to the second drain electrode of the second transistor,
   wherein the second voltage line is disposed in a middle of the adjacent data lines and overlaps the gate line, the first voltage line, and the third voltage line,
   wherein the first voltage line includes first and second elongated parts connected at ends of first voltage line and extending along a same direction as the second voltage line, and the third voltage line includes third and fourth elongated parts connected at ends of third voltage line and extending along the same direction as the second voltage line, and
   wherein the third gate electrode opposes the third voltage line with respect to the gate line therebetween.

2. The liquid crystal display of claim 1, wherein
   the first transistor and the second transistor include a first semiconductor, and
   the third transistor includes a second semiconductor spaced apart from the first semiconductor.

3. The liquid crystal display of claim 2, wherein
   the first gate electrode and the second gate electrode are connected to each other to form a gate electrode,
   the first semiconductor overlaps the gate electrode, and
   the second semiconductor overlaps the third gate electrode.

4. The liquid crystal display of claim 3, wherein an edge of the first semiconductor is disposed inside an edge of the gate electrode and the gate line in a plan view, and the edge of the first semiconductor is spaced apart from the edge of the gate electrode and the gate line.

5. The liquid crystal display of claim 4, wherein an edge of the second semiconductor is disposed inside an edge of the third gate electrode and the first voltage line in the plan view, and the edge of the second semiconductor is spaced apart from the edge of the third gate electrode and the first voltage line.

6. The liquid crystal display of claim 3, wherein the gate line extends in a first direction, the first source electrode and the second source electrode include two first branches respectively extending in a second direction perpendicular to the first direction, the first drain electrode includes a second branch disposed between the two first branches, and a first extended part connected to the second branch, and the second drain electrode includes a third branch extending in the second direction, and a second extended part connected to the third branch.

7. The liquid crystal display of claim 6, wherein the second voltage line is spaced apart from the data line and is disposed in a same conductive layer as the data line, and the third drain electrode extends in the second direction.

8. The liquid crystal display of claim 7, wherein the first extended part and the second extended part are faced each other with respect to the gate line in a plan view.

9. The liquid crystal display of claim 8, wherein one terminal end of the first liquid crystal capacitor includes a first sub-pixel electrode electrically connected to the first drain electrode, one terminal end of the second liquid crystal capacitor includes a second sub-pixel electrode electrically connected to the second drain electrode, and the first sub-pixel electrode and the second sub-pixel electrode are faced each other with respect to the gate line in a plan view.

10. The liquid crystal display of claim 9, wherein the first extended part overlaps the third voltage line to form a first storage capacitor, and the second extended part overlaps the first voltage line to form a second storage capacitor.

11. The liquid crystal display of claim 3, wherein a voltage transmitted by the first voltage line and a voltage transmitted by the second voltage line are constant.

* * * * *